United States Patent
Euen et al.

(10) Patent No.: US 7,923,359 B1
(45) Date of Patent: Apr. 12, 2011

(54) REDUCTION OF SHEET RESISTANCE OF PHOSPHORUS IMPLANTED POLY-SILICON

(75) Inventors: Wolfgang Euen, Kleve (DE); Stephan Gross, Altdorf (DE)

(73) Assignee: NXP B.V., Eindhoven (NL)

(*) Notice: Subject to any disclaimer, the term of this patent is extended or adjusted under 35 U.S.C. 154(b) by 379 days.

(21) Appl. No.: 11/576,344

(22) PCT Filed: Sep. 28, 2005

(86) PCT No.: PCT/IB2005/053208
§ 371 (c)(1), (2), (4) Date: Jul. 24, 2009

(87) PCT Pub. No.: WO2006/035411
PCT Pub. Date: Apr. 6, 2006

Related U.S. Application Data

(60) Provisional application No. 60/614,860, filed on Sep. 29, 2004.

(51) Int. Cl.
*H01L 21/425* (2006.01)

(52) U.S. Cl. .................. 438/520; 257/E21.343
(58) Field of Classification Search .......... 438/520, 438/527; 257/E21.343
See application file for complete search history.

(56) References Cited

U.S. PATENT DOCUMENTS

| | | | | |
|---|---|---|---|---|
| 4,933,296 | A * | 6/1990 | Parks et al. | 438/30 |
| 5,962,896 | A * | 10/1999 | Yabuta et al. | 257/347 |
| 6,465,311 | B2 * | 10/2002 | Shenoy | 438/300 |
| 6,744,108 | B1 * | 6/2004 | Pan | 257/412 |

* cited by examiner

*Primary Examiner* — W. David Coleman

(57) ABSTRACT

There is a process for reducing the sheet resistance of phosphorus-implanted poly-silicon. In an example embodiment, there is an MOS transistor structure. The structure has a gate region, drain region and a source region. A method for reducing the sheet resistance of the gate region comprises depositing intrinsic amorphous silicon at a predetermined temperature onto the gate region. An amorphizing species is implanted into the intrinsic amorphous silicon. Phosphorus species are then implanted into the gate region of the MOS transistor structure. A feature of this embodiment includes using Ar+ as the amorphizing species.

11 Claims, 6 Drawing Sheets

REDUCTION OF SHEET RESISTANCE OF PHOSPHORUS IMPLANTED POLY-SILICON

The invention relates to semiconductor processing. More particularly this invention relates to a process to minimize phosphorus penetration through gate oxide from highly doped poly-silicon gate electrodes during high temperature anneals.

The electronics industry continues to rely upon advances in semiconductor technology to realized higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

In an example process technology used to build DMOS transistors, commonly makes use of high thermal budget to achieve sufficiently high diffusion for driving the dope of the drain region underneath the poly-silicon gate edge. During the anneal phosphorus from the poly-silicon gate electrode diffuses through the gate oxide into the channel region of the transistor. The phosphorus penetration alters the threshold voltage of the device and causes an increased VT roll off for short channel devices. Both effects degrade the device performance.

In a conventional process, phosphorus diffusion from highly phosphorus-doped poly-silicon ($\geq$e20 cm-3) through thermally grown oxide into the single crystal silicon has been observed after a high temperature anneal ($\geq$1100° C.) for prolonged diffusion time. The unwanted phosphorus penetration influences the nominal threshold voltage value and, furthermore, degrades the threshold voltage roll off for short channel devices There is a need for a process that maintains the desired threshold voltage and keeps VT roll off to an acceptable level for short channel devices. Such a process reduces costs by increasing device yield.

In an example embodiment, there is an MOS transistor structure. The structure has a gate region, drain region and source region. A method for reducing the sheet resistance of the gate region, the method comprises, depositing intrinsic amorphous silicon at a predetermined temperature onto the gate region. Amorphizing species are implanted at a first predetermined dose into the intrinsic amorphous silicon in the gate region. At a second predetermined dose, phosphorus species are implanted into the gate region. Additional features of this embodiment include the depositing of the intrinsic amorphous silicon at the predetermined temperature in the range of about 53° C. to about 550° C. Furthermore, the poly-silicon sheet resistance is adjusted to be in the range of about 18 ohms/square to about 30 ohms/square. Also, the first predetermined dose of amorphizing species is in the range of about $1 \times 10^{15}$ cm$^{-2}$ to about $3 \times 10^{15}$ cm$^{-2}$ and the second predetermined dose of phosphorus is in the range of about $1 \times 10^{14}$ cm$^{-2}$ to about $1.6 \times 10^{16}$ cm$^{-2}$.

In another example embodiment, there is a method of forming a MOS integrated circuit. The method comprises, forming a gate oxide on the substrate. At a predetermined temperature, on the gate oxide, amorphous silicon is deposited. At a predetermined dose, the amorphous silicon is amorphized with an Ar+ implant. Into the amorphous silicon, phosphorus is implanted. Patterning the amorphous silicon defines a gate region.

The above summaries of the present invention are not intended to represent each disclosed embodiment, or every aspect, of the present invention. Other aspects and example embodiments are provided in the figures and the detailed description that follows.

The invention may be more completely understood in consideration of the following detailed description of various embodiments of the invention in connection with the accompanying drawings, in which.

Figure 1:
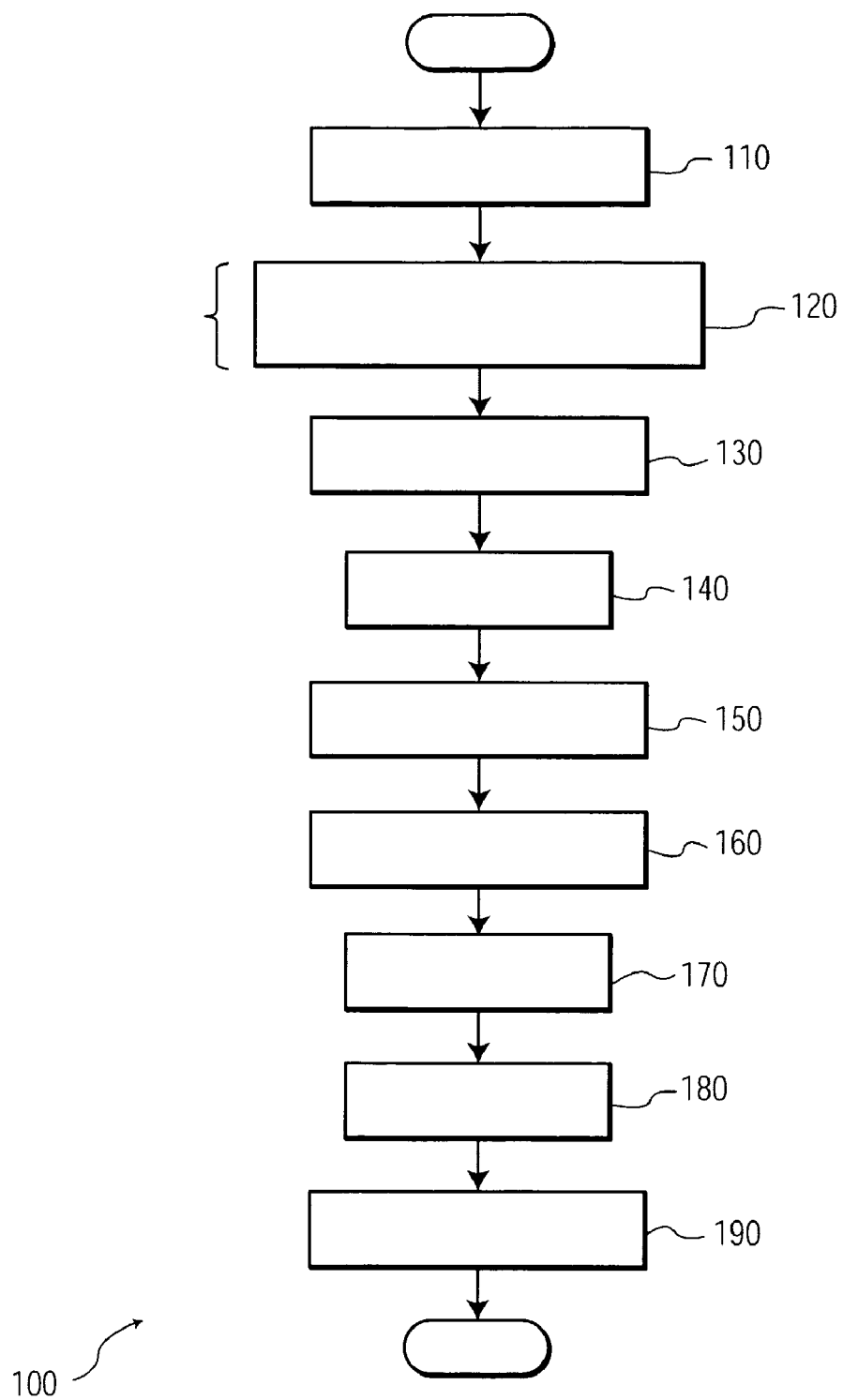
FIG. 1 (Prior Art) illustrates a conventional process flow for a doped poly-silicon process.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

Refer to FIG. 1. In an example conventional process 100, on a silicon-on-insulator (SOI) substrate, a gate oxide is grown 110.

Upon the gate oxide, poly-silicon is deposited, phosphorus is doped in situ into the poly-silicon 120. Next, the poly-silicon undergoes patterning 130 to define the desired features. Oxide is deposited on the patterned poly-silicon 140. A spacer is formed with an etch 150. Upon the poly-silicon a screen oxide is grown 160. Areas to be implanted with n-LDD are masked 170. The poly-silicon region is protected with the mask. After masking, the n-LDD is implanted 180. The implanted species are then diffused 190. These diffusion areas ultimately define the source and drain regions of the transistor. Additional details of the process are outlined in descriptions of FIGS. 3A-3E.

Figure 3A:
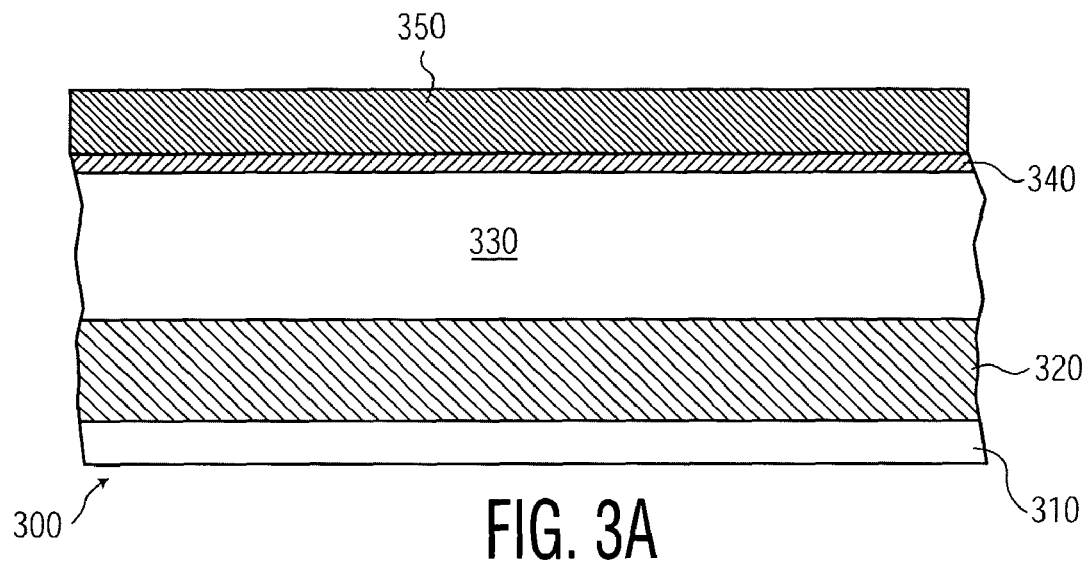
FIGS. 3A-3E illustrate cross-sections of a DMOS device on silicon-on-insulator substrate fabricated according to the process of FIG. 1.
Figure 3B:
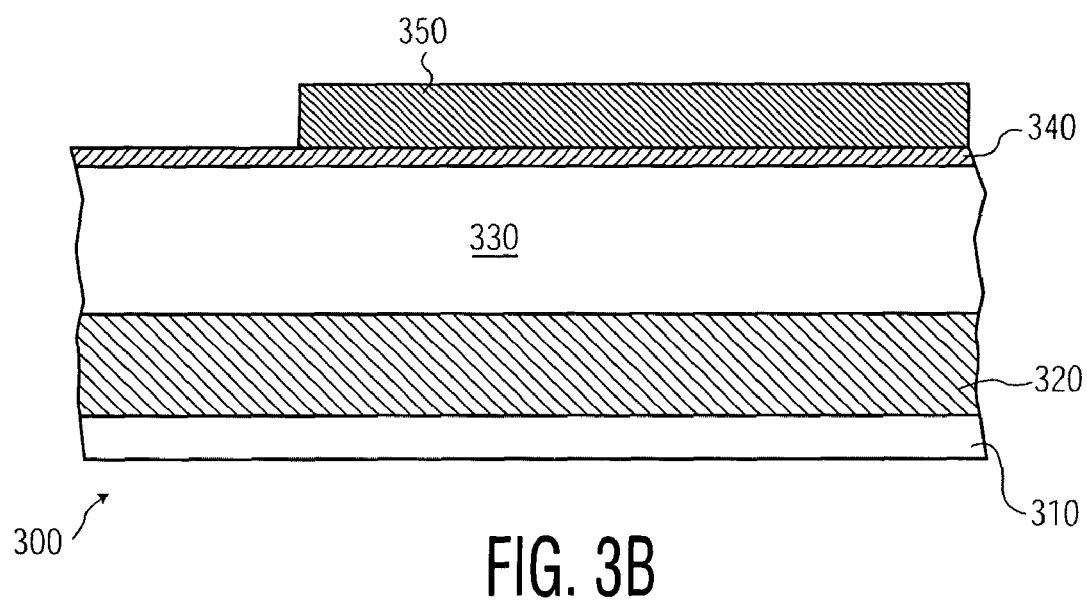
Figure 3C:
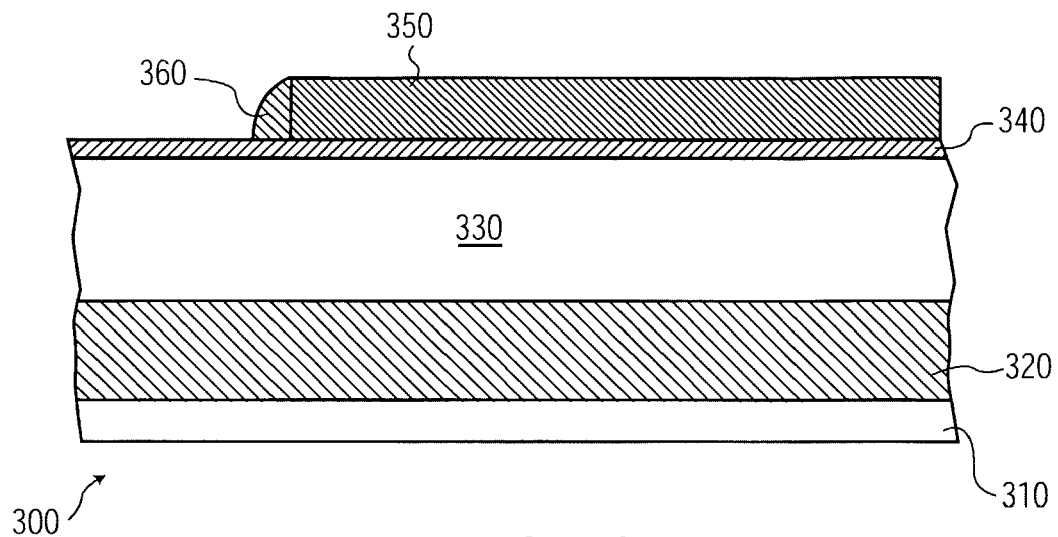
Figure 3D:
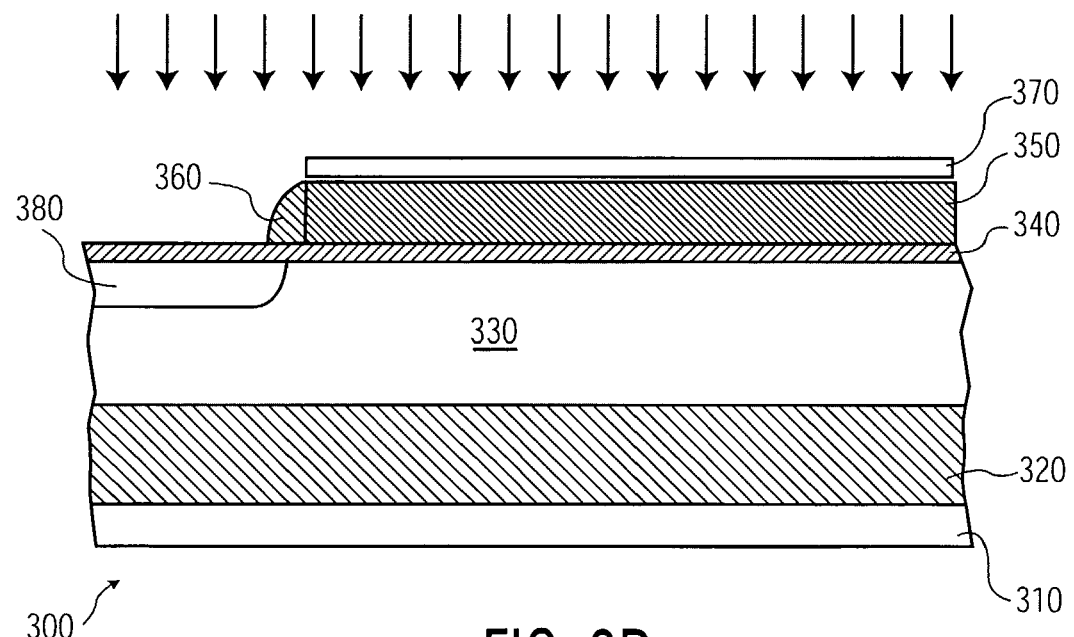
Figure 3E:
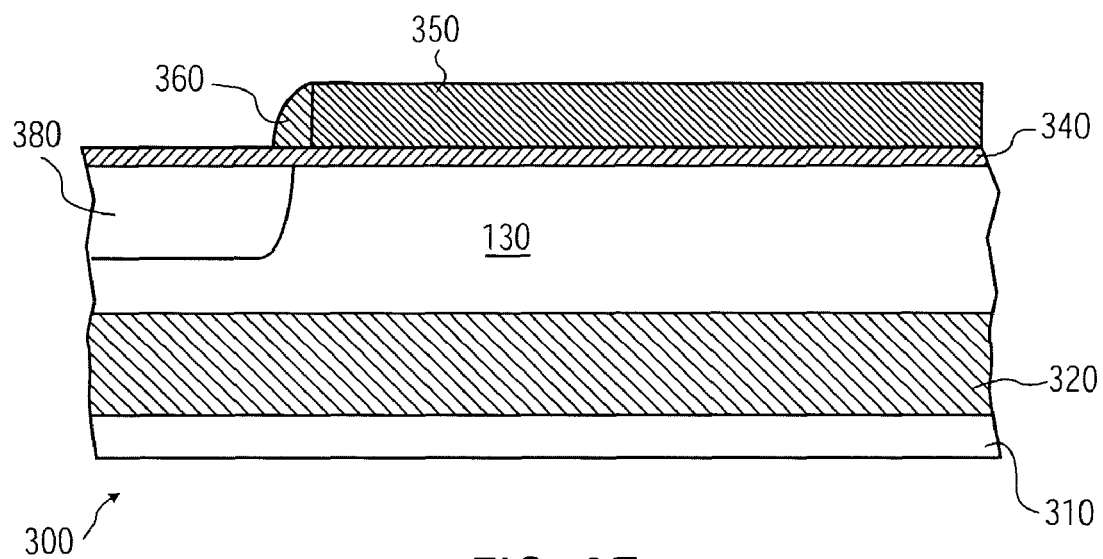

FIGS. 3A-3E show in cross-section the steps outlined in the discussion of FIG. 1. In building a DMOS device on a silicon-on-insulator (SOI) substrate. Refer to FIG. 3A. An SOI substrate 100 includes a silicon layer 110, a base oxide (BOX) layer 120, and a SOI layer 130. A thin oxide layer 140 is grown. The oxide is grown at a temperature of about 800° C. in a wet ambient. The thickness grown is about 30 nm. In a conventional process, upon the grown oxide 140, a poly-silicon layer 150 is deposited thereon at about 680° C. The poly-silicon deposition 150 is phosphorus dope in situ. Refer to FIG. 3B. Having deposited the poly-silicon layer 150 and doping it, the poly-silicon layer 150 is patterned. Desired features of the DMOS device are defined. The poly-silicon layer ultimately becomes part of the gate structure of the DMOS transistor. Oxide is deposited on the poly-silicon and the region 150' defined in the poly-silicon patterning. The oxide is deposited at about 680° C. at a thickness of about 300 nm. The oxide coating is conformal to the underlying topography. Refer to FIG. 3C. With a plasma etch (i.e., "spacer etch") the oxide coating is etched to form a spacer 160. Refer to FIG. 3D. To prevent channeling of implants (in later steps), an oxide is grown in a 1000° C. dry ambient at a thickness of about 18 nm. An SND (shallow N-diffusion) mask is applied. An n-low-doped-drain (LDD) implant of phosphorus, at an energy of about 40 keV, at a dose of $3.5 \times 10^{13}$ cm$^{-2}$, at 0° is deposited in a source/drain region 180. Refer to FIG. 3E. To activate the implant region 180, the substrate 100 undergoes diffusion at about 1100° C. for about 480 min.

Figure 2:
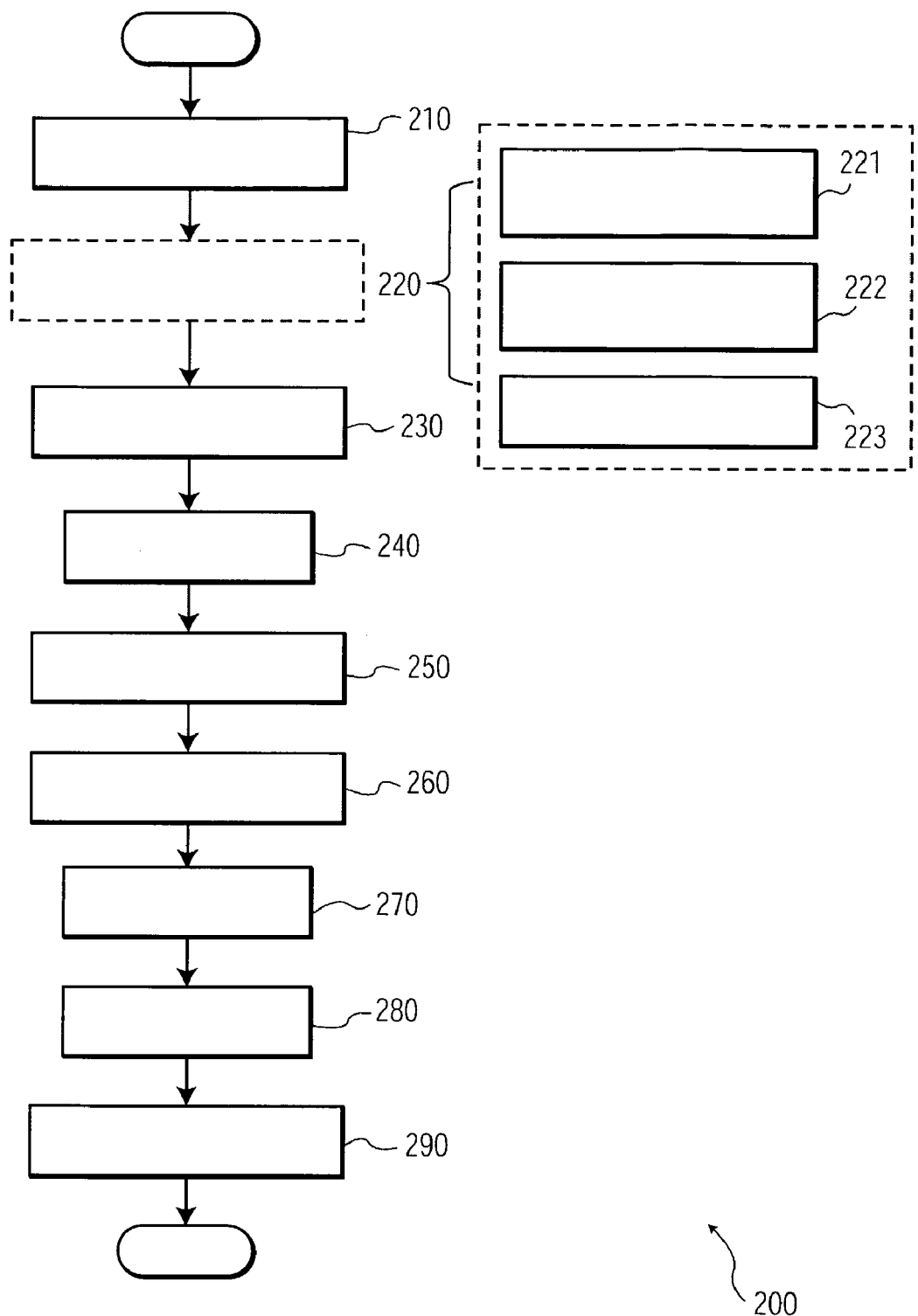
FIG. 2 illustrates a process flow for building the silicon gate region according to an embodiment of the present invention.

In contrast to a conventional process, in an embodiment according to the present invention the in situ doped poly-silicon is replaced with intrinsic amorphous silicon deposited at about 540° C. After the amorphous silicon deposition, there is an Ar+ (argon ion) implant to further amorphize the silicon. The amorphous silicon is then implanted with phosphorus. This amorphous silicon replaces the poly-silicon 150 of the conventional process. Refer to FIG. 2. The process 200 is similar to that outlined in FIG. 1. A gate oxide is grown 210 on an SOI substrate. However, the modified process flow 220 includes the deposition of intrinsic amorphous silicon 221. After the deposition of intrinsic amorphous silicon, there is an amorphization with Ar+ implant 222. The modified process 220 is completed with an implant of phosphorus 223. The remaining process steps 230 through 290 follow that of FIG. 1.

Figure 4:
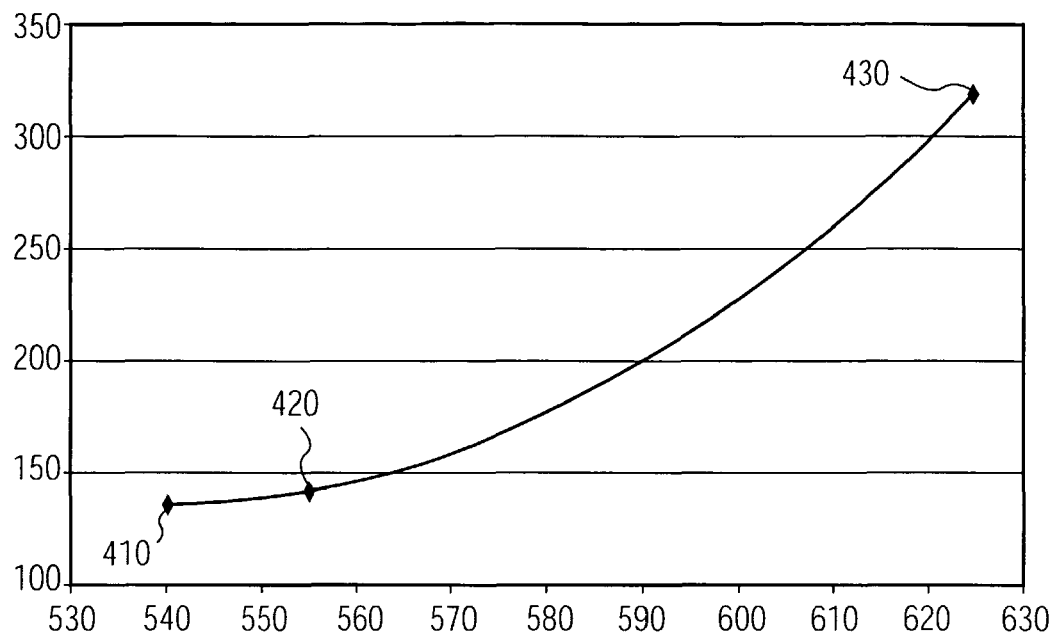
FIG. 4 is a plot of N+ doped poly-silicon sheet resistance Rs versus poly-silicon deposition temperature.

Refer to FIG. 4. In an example process according to the present invention, a plot depicts the N+ doped poly-silicon sheet resistance versus the poly-silicon deposition temperature. At about 540° C. the sheet resistance (410) is about 140 ohms/square whereas at about 625° C. the sheet resistance (430) rises to about 325 ohms/square. The sheet resistance is less than about one half of the example conventional process. The sheet resistance (420) rises to about 145 ohms/square at a deposition temperature of about 555° C.

Figure 5:
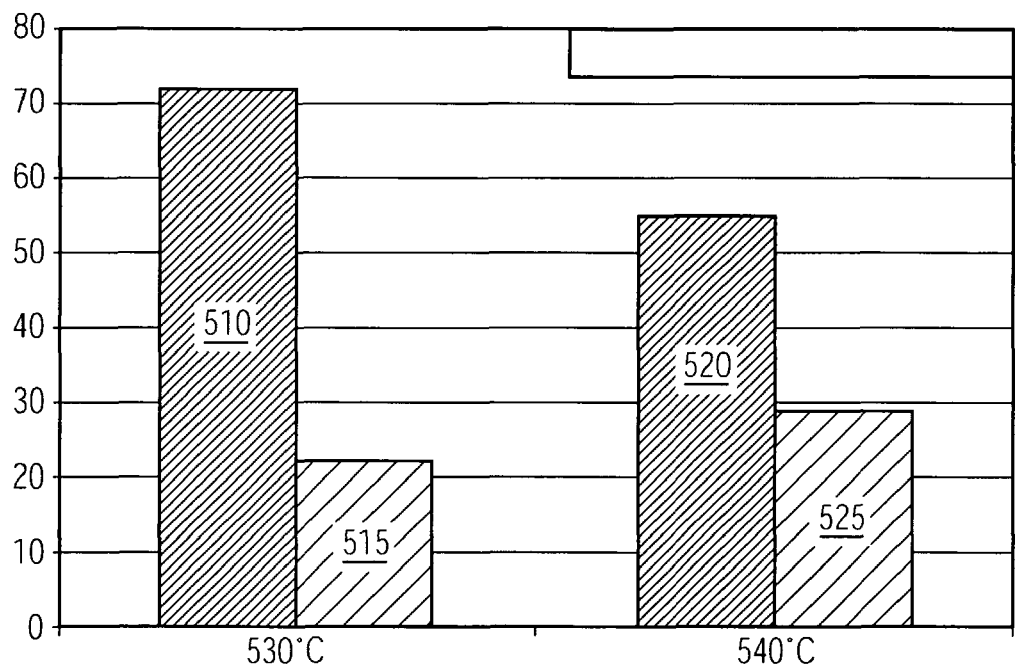
FIG. 5 is a plot of poly-silicon sheet resistance $R_s$ versus poly-silicon deposition temperature for two temperatures with and without the Ar+ implant of the present invention.

Refer to FIG. 5. In an example process according to the present invention, the sheet resistance of poly-silicon of about 360 nm versus deposition temperature and Ar+ pre-amorphization implant is plotted for a sample number of wafers at two poly-silicon deposition temperatures of 530° C. and 540° C., respectively. The phosphorus concentration in the poly-silicon may be reduced with the pre-amorphization technique without increasing the sheet resistance. There is a reduction of phosphorus penetration through the gate oxide compared with that of the 1100° C./480 min anneal. Curves 510, 520 are for wafers without the Ar+ implant. At 530° C. the sheet resistance is about 72 ohms/square. At 540° C., the sheet resistance is about 55 ohms/square. Curves, 515 and 525 are for wafers with the Ar+ implant. At 530° C., the sheet resistance is about 22 ohms/square and at 540° C., the sheet resistance is about 28 ohms/square.

In the example embodiments presented, Ar+ had been chosen as an amorphization species. Other species may be chosen, as well. For example Si+ or other species heavy enough to amorphize silicon, yet do not act as a dopant, are suitable.

While the present invention has been described with reference to several particular example embodiments, those skilled in the art will recognize that many changes may be made thereto without departing from the spirit and scope of the present invention, which is set forth in the following claims.

What is claimed is:

1. In an MOS transistor structure, the structure having a gate region, drain region and source region, a method for reducing the sheet resistance of the gate region, the method comprising:
   depositing intrinsic amorphous silicon at a predetermined temperature onto the gate region;
   implanting amorphizing species at a first predetermined dose into the intrinsic amorphous silicon in the gate region; and
   implanting phosphorus species into the gate region at a second predetermined dose.

2. The method as recited in claim 1, wherein the predetermined temperature is in the range of about 530° C. to about 550° C.

3. The method as recited in claim 1, wherein the amorphizing species are sufficiently heavy to amorphize silicon.

4. The method as recited in claim 1, wherein the poly-silicon sheet resistance is adjusted to be in the range of about 18 ohms/square to about 30 ohms/square.

5. The method as recited in claim 1, wherein the predetermined temperature is in the range of about 535° C. to about 545° C.

6. The method as recited in claim 1, wherein the predetermined temperature is about 540° C.

7. The method as recited in claim 1, wherein the first predetermined dose of amorphizing species is in the range of about $1 \times 10^{15}$ cm$^{-2}$ to about $3 \times 10^{15}$ cm$^{-2}$.

8. The method as recited in claim 1, wherein the second predetermined dose of phosphorus is in the range of about $1 \times 10^{14}$ cm$^{-2}$ to about $1.6 \times 10^{16}$ cm$^{-2}$.

9. The method as recited in claim 1, wherein the second predetermined dose of phosphorus is about $3.0 \times 10^{15}$ cm$^{-2}$.

10. The method as recited in claim 3, wherein the amorphizing species includes argon, and silicon.

11. A method of forming a MOS integrated circuit comprising:
   forming a gate oxide on a substrate;
   depositing amorphous silicon on the gate oxide at a predetermined temperature;
   amorphizing the amorphous silicon with an Ar+ implant at a predetermined dose;
   implanting phosphorus another predetermined dose into the amorphous silicon; and
   patterning the amorphous silicon to define a gate region.

* * * * *